(12) United States Patent
Koshimizu et al.

(10) Patent No.: US 8,734,910 B2
(45) Date of Patent: May 27, 2014

(54) ELECTROCONDUCTIVE PASTE FOR ELECTRON BEAM CURING AND CIRCUIT BOARD PRODUCTION METHOD USING SAME

(75) Inventors: Kazutoshi Koshimizu, Sakura (JP); Shigeo Ota, Uji (JP)

(73) Assignees: Fujikura Ltd., Tokyo (JP); Goo Chemical Co., Ltd, Kyoto (JP)

( * ) Notice: Subject to any disclaimer, the term of this patent is extended or adjusted under 35 U.S.C. 154(b) by 0 days.

(21) Appl. No.: 13/533,384

(22) Filed: Jun. 26, 2012

(65) Prior Publication Data
US 2012/0269984 A1    Oct. 25, 2012

Related U.S. Application Data

(63) Continuation of application No. PCT/JP2011/050944, filed on Jan. 20, 2011.

(30) Foreign Application Priority Data

Jan. 21, 2010 (JP) .................................. 2010-011313

(51) Int. Cl.
*C08F 2/54* (2006.01)

(52) U.S. Cl.
USPC .......................................... 427/496; 427/504

(58) Field of Classification Search
USPC ................................. 427/496, 504
See application file for complete search history.

(56) References Cited

U.S. PATENT DOCUMENTS

| | | | |
|---|---|---|---|
| 5,622,652 A * | 4/1997 | Kucherovsky et al. | ....... 252/511 |
| 2003/0151032 A1 | 8/2003 | Ito et al. | |
| 2008/0169122 A1* | 7/2008 | Shiraishi et al. | .............. 174/257 |
| 2009/0053520 A1 | 2/2009 | Lu et al. | |

FOREIGN PATENT DOCUMENTS

| | | | |
|---|---|---|---|
| CN | 1359118 A | | 7/2002 |
| CN | 101171317 A | | 4/2008 |
| EP | 1 387 367 A1 | | 4/2004 |
| JP | 57187339 A | * | 11/1982 |
| JP | 1992007369 A | | 1/1992 |
| JP | 06-157945 A | | 6/1994 |
| JP | 06-228442 A | | 8/1994 |
| JP | 2758432 B2 | | 5/1998 |
| JP | 2001181317 A | | 7/2001 |

(Continued)

OTHER PUBLICATIONS

Office Action in corresponding Chinese Patent Application No. 201180004692.1 dated May 9, 2013.

(Continued)

*Primary Examiner* — Elena T Lightfoot
(74) *Attorney, Agent, or Firm* — Sughrue Mion, PLLC

(57) ABSTRACT

The present invention provides an electroconductive paste for electron beam curing that allows the formation of a circuit board having an electroconductive layer that has superior hardness and bendability as well as superior adhesion to a plastic base even if used in a high-temperature environment. The present invention is an electroconductive paste for electron beam curing comprising an electroconductive powder, a radical polymerizable composition and a plasticizer, wherein the plasticizer is incorporated at a ratio of 5 parts by mass to 20 parts by mass based on 100 parts by mass of the radical polymerizable composition.

6 Claims, 1 Drawing Sheet

(56) References Cited

FOREIGN PATENT DOCUMENTS

| | | | |
|---|---|---|---|
| JP | 2002-047410 A | | 2/2002 |
| JP | 2002-322228 A | | 11/2002 |
| JP | 2005-015627 A | | 1/2005 |
| JP | 2007056110 A | * | 3/2007 |
| JP | 2007-131754 A | | 5/2007 |
| JP | 2009-245648 A | | 10/2009 |
| JP | 2009-295895 A | | 12/2009 |
| TW | I256059 | | 6/2006 |

OTHER PUBLICATIONS

Office Action issued in Taiwan Patent Application No. 10220582090 dated May 8, 2012.

* cited by examiner

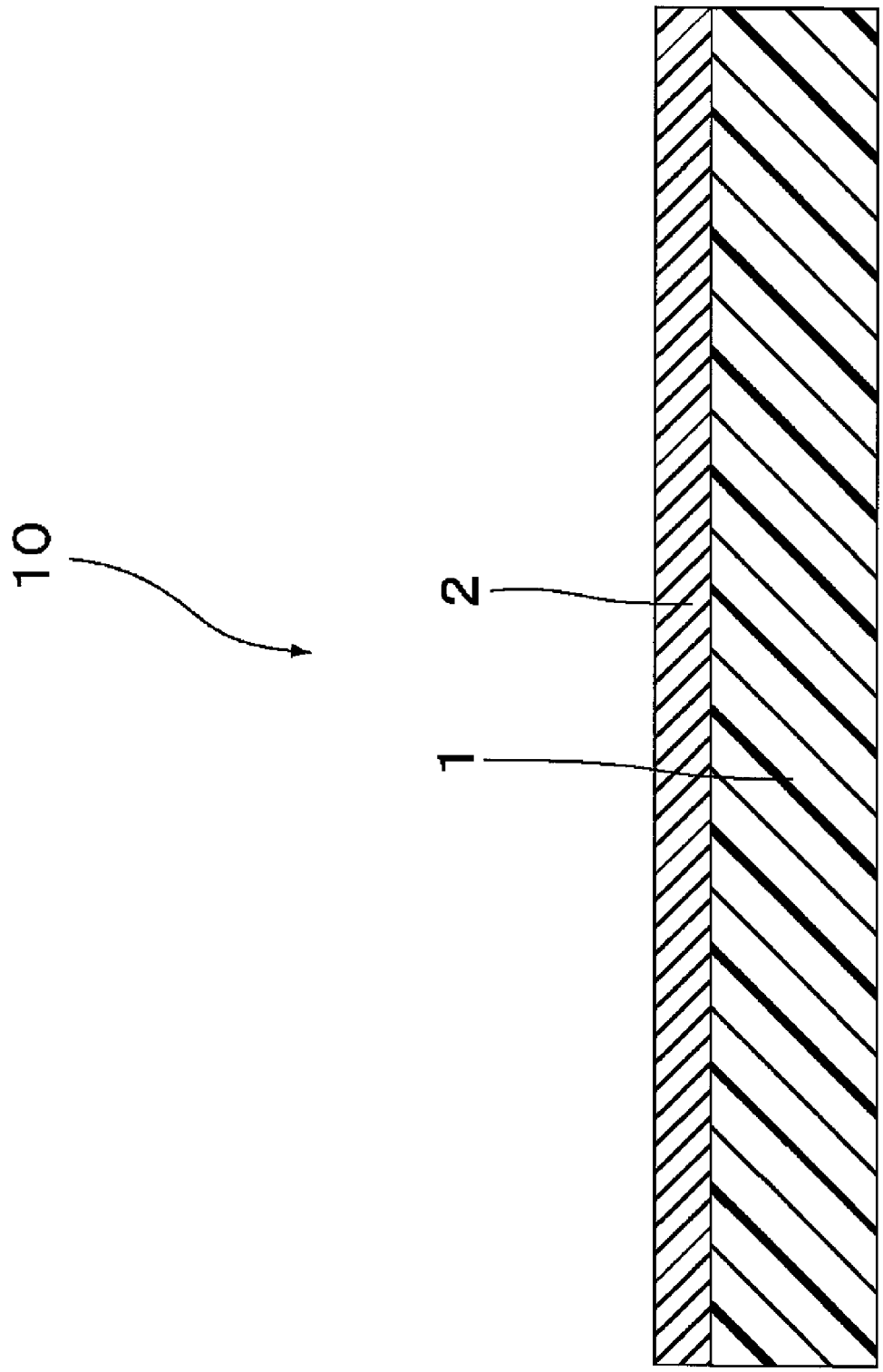

US 8,734,910 B2

ELECTROCONDUCTIVE PASTE FOR ELECTRON BEAM CURING AND CIRCUIT BOARD PRODUCTION METHOD USING SAME

CROSS REFERENCE TO RELATED APPLICATIONS

This application is a Continuation of International Application No. PCT/JP2011/050944 filed Jan. 20, 2011, claiming priority based on Japanese Patent Application No. 2010-011313 filed Jan. 21, 2010, the contents of all of which are incorporated herein by reference in their entirety.

TECHNICAL FIELD

The present invention relates to an electroconductive paste for electron beam curing and a circuit board production method that uses the same.

BACKGROUND ART

Circuit boards are used in the membrane switches used in personal computer keyboards, seating sensors, pressure sensors and the like. Some of the circuit boards are composed of a plastic film and an electroconductive layer obtained by printing an electroconductive paste for electron beam curing on the plastic film and curing the paste by irradiating with an electron beam.

An electroconductive paste that uses a radical polymerizable resin such as an acrylate compound is known as an electroconductive paste for electron beam curing used to form these circuit boards (Patent Documents 1 and 2). Radical polymerizable resins cause an increase in the crosslink density of the electroconductive paste and increase curing shrinkage ratio. In addition, when an electroconductive layer is formed by coating an electroconductive paste for electron beam curing containing a radical polymerizable resin onto a plastic film and curing by irradiating with an electron beam, sufficient hardness can be imparted to the electroconductive layer.

On the other hand, an electroconductive paste obtained by mixing a cationically polymerizable resin into a radical polymerizable resin is known as an electroconductive paste for electron beam curing (Patent Document 3). Since this electroconductive paste for electron beam curing allows the proportion of radical polymerizable resin to be reduced, curing shrinkage during the curing process can be inhibited.

PRIOR ART

Patent Document

Patent Document 1: Japanese Patent Publication No. 2758432
Patent Document 2: Japanese Patent Application Publication No. H6-157945
Patent Document 3: Japanese Patent Application Publication No. 2005-15627

SUMMARY OF THE INVENTION

Problems to be Solved by the Invention

However, the inventors of the present invention found that the electroconductive pastes for electron beam curing described in the above-mentioned Patent Documents 1 to 3 have the problems indicated below. Namely, in the case of producing a circuit board by forming electroconductive layer on a plastic base using the electroconductive pastes for electron beam curing described in Patent Documents 1 to 3 and using the circuit board in a high-temperature environment, adhesion of the electroconductive layer to the plastic film and bendability of the electroconductive layer are insufficient. Consequently, in the case of using the circuit board in a high-temperature environment, the electroconductive layer occasionally separated from the plastic film. Alternatively if the circuit board is repeatedly bent in a high-temperature environment, cracks and the like formed in the electroconductive layer.

Consequently, there was a need for an electroconductive paste for electron beam curing capable of forming a circuit board having an electroconductive layer that has superior hardness and bendability as well as superior adhesion to a plastic base even if used in a high-temperature environment.

With the foregoing in view, an object of the present invention is to provide an electroconductive paste for electron beam curing capable of forming a circuit board having an electroconductive layer that has superior hardness and bendability as well as superior adhesion to a plastic base even if used in a high-temperature environment, and a circuit board production method that uses this paste.

Means for Solving the Problems

The inventors of the present invention conducted extensive studies focusing on plasticizers in order to solve the above-mentioned problems. Plasticizers have been commonly thought to decrease the hardness of an electroconductive layer as a result of causing a relative decrease in the proportion of high-strength crosslinked resin due to the addition thereof to an electroconductive paste. In addition, plasticizers either escape from the electroconductive layer or cause a reaction with other components in a high-temperature environment. As a result, they have been commonly thought to subsequently cause a considerable decrease in bendability of the electroconductive layer and adhesion of the electroconductive layer to the plastic base. Consequently, plasticizers have heretofore not been used in the field of electroconductive pastes for electron beam curing. However, the inventors of the present invention formed an electroconductive layer by radiating an electron beam onto an electroconductive paste for electron beam curing obtained by incorporating a plasticizer in a radical polymerizable resin composition at a prescribed ratio. As a result, the inventors of the present invention unexpectedly found that the above-mentioned problems can be solved, thereby leading to completion of the present invention.

Namely, the present invention is an electroconductive paste for electron beam curing having: an electroconductive powder; a radical polymerizable composition; and a plasticizer, wherein the plasticizer is incorporated at a ratio of 5 parts by mass to 20 parts by mass based on 100 parts by mass of the radical polymerizable composition.

According to this electroconductive paste for electron beam curing, when a circuit board is formed by applying the electroconductive paste for electron beam curing onto a plastic base and curing by irradiating with an electron beam to form an electroconductive layer, an electroconductive layer can be obtained that has superior hardness and bendability as well as superior adhesion to the plastic base even if the circuit board is used in a high-temperature environment.

Here, although the reason why the above-mentioned effects are obtained are not certain, the inventors of the present invention presume this to be as described below based on the relationship with the result in the case of heat-curing the above-mentioned electroconductive paste.

Namely, the inventors of the present invention first heat-cured the above-mentioned electroconductive paste for electron beam curing containing a small amount of a polymerization initiator, and held the resulting electroconductive layer in a high-temperature environment. As a result, bendability of the electroconductive layer was determined to have decreased slightly and adhesion to the plastic base was determined to have decreased considerably. With respect to the reason for this, the inventors of the present invention presume that, as a result of the plasticizer volatilizing and escaping during heat curing, the effect of the plasticizer was not sufficiently obtained, and since an adequate crosslink density was not obtained during heat curing, the plasticizer escaped or underwent a chemical reaction with other components as a result of holding the electroconductive paste in a high-temperature environment. In contrast, in the case of irradiating the above-mentioned electroconductive paste for electron beam curing with an electron beam, since heat is not applied during curing, it is presumed to be difficult for the plasticizer to escape. In addition, sufficient crosslink density is obtained as a result of irradiating with an electron beam. Consequently, it is presumed that it is difficult for the plasticizer to escape and to undergo a chemical reaction with other components even if the electroconductive paste is held in a high-temperature environment. Moreover, the plasticizer is incorporated at a low ratio with respect to the radical polymerizable composition, and does not cause a large decrease in the relative ratio of the cured radical polymerizable composition. Consequently, the inventors of the present invention presume that an electroconductive layer could be obtained that has superior hardness and bendability as well as superior adhesion to the plastic base even if the circuit board is used in a high-temperature environment.

In the above-mentioned electroconductive paste for electron beam curing, the plasticizer is preferably a dicarboxylate. In this case, more superior bendability can be imparted to the electroconductive layer. In addition, if the plasticizer is a dicarboxylate, heat resistance, dispersibility and meltability can be further improved.

In the above-mentioned electroconductive paste for electron beam curing, the dicarboxylate is preferably dioctyl adipate. In this case, heat resistance can be further improved.

In the above-mentioned electroconductive paste for electron beam curing, the plasticizer is preferably incorporated at a ratio of 5 parts by mass to 10 parts by mass based on 100 parts by mass of the radical polymerizable composition. In this case, more superior hardness tends to be able to be obtained.

In the above-mentioned electroconductive paste for electron beam curing, the radical polymerizable composition preferably contains a mixture of a bifunctional urethane-based oligomer and a monofunctional acrylate monomer.

In this case, various coated films can be obtained according to the structure of polyol and the type of isocyanate in the urethane-based oligomer.

In the above-mentioned electroconductive paste for electron beam curing, the radical polymerizable composition preferably further contains a di(meth)acrylate having an oxyalkylene unit from the viewpoint of improving heat resistance and improving softening point.

In addition, the present invention is a method for producing a circuit board provided with a plastic base and an electroconductive layer provided on the plastic base, the method including: a step of coating the previously described electroconductive paste for electron beam curing on the plastic base; and a step of obtaining the circuit board by curing the electroconductive paste for electron beam curing by irradiating with an electron beam to form the electroconductive layer.

According to this circuit board production method, a circuit board can be produced having an electroconductive layer that has superior hardness and bendability as well as superior adhesion to the plastic base even if used in a high-temperature environment. Consequently, separation of the electroconductive layer from the plastic base is sufficiently inhibited even if the circuit board is used in a high-temperature environment. In addition, the formation of cracks and the like in the electroconductive layer is sufficiently inhibited even if the circuit board is repeatedly bent in a high-temperature environment.

Effects of the Invention

According to the present invention, an electroconductive paste for electron beam curing, which is capable of forming a circuit board having an electroconductive layer that has superior hardness and bendability as well as superior adhesion to a plastic base even if used in a high-temperature environment, and a circuit board production method that uses that paste, are provided.

BRIEF DESCRIPTION OF THE DRAWING

FIG. 1 is a cross-sectional view showing an example of a circuit board produced according to the circuit board production method according to the present invention.

MODE FOR CARRYING OUT THE INVENTION

The following provides a detailed explanation of embodiments of the present invention.

FIG. 1 is a cross-sectional view showing an example of a circuit board produced according to the circuit board production method according to the present invention. As shown in FIG. 1, a circuit board 10 is provided with a plastic base 1 and an electroconductive layer 2 provided on the plastic base 1.

Here, the electroconductive layer 2 can be obtained by coating an electroconductive paste for electron beam curing (to be simply referred to as an "electroconductive paste") on the plastic base 1, and curing the electroconductive paste by irradiating with an electron beam. As the electroconductive paste, a paste which contains an electroconductive powder, a radical polymerizable composition and a plasticizer, and in which the plasticizer is incorporated at the ratio of 5 parts by mass to 20 parts by mass based on 100 parts by mass of the radical polymerizable composition is used.

In this circuit board 10, the electroconductive layer 2 has superior hardness and bendability as well as superior adhesion to the plastic base 1 even if the circuit board 10 is used in a high-temperature environment. Consequently, separation of the electroconductive layer 2 from the plastic base 1 is sufficiently inhibited even if the circuit board 10 is used in a high-temperature environment. In addition, the formation of cracks and the like in the electroconductive layer 2 is sufficiently inhibited even if the circuit board 10 is used while repeatedly bending in a high-temperature environment.

Next, an explanation is provided of a production method of the circuit board 10. First, the electroconductive paste is coated onto the plastic base 1.

(Plastic Base)

There are no particular limitations on the plastic that composes the plastic base 1 provided it is a plastic. Examples of such plastics include polyester resins such as polyethylene terephthalate resin (PET) or polyethylene naphthalate resin (PEN).

The electroconductive paste contains an electroconductive powder, a radical polymerizable composition and a plasticizer as previously described.

(Electroconductive Powder)

Examples of electroconductive powders that can be used include not only metals such as gold, silver, copper, platinum, palladium, nickel or alloys of two or more types thereof, but also carriers such as plastics, ceramics, or the like coated with the above-mentioned metals. Silver is preferably used for the above-mentioned metal since it demonstrates only a small decrease in electrical conductivity caused by oxidation.

There are no particular limitations on the shape of the electroconductive powder, and examples of the shape of the electroconductive powder include scales, needles and spheres.

Although there are no particular limitations on the mean particle diameter of the electroconductive powder, it is normally 0.5 μm to 15 μm and preferably 1 μm to 5 μm.

(Radical Polymerizable Composition)

There are no particular limitations on the radical polymerizable composition (radical polymerizable material) provided it is a material that undergoes radical polymerization when irradiated with an electron beam, and the radical polymerizable composition contains, for example, polyester(meth)acrylate, polyurethane(meth)acrylate or polyether(meth)acrylate. These may be used alone or two or more types may be used as a mixture. Among these, polyurethane(meth)acrylate is preferable since it allows the obtaining of various coated films according to the structure of polyol and the type of isocyanate.

Furthermore, although polyurethane(meth)acrylate can be obtained by, for example, reacting a bifunctional urethane-based oligomer with a monofunctional acrylate monomer, instead of polyurethane(meth)acrylate, the radical polymerizable composition may contain a mixture of polyurethane (meth)acrylate in the form of a bifunctional urethane-based oligomer and a monofunctional acrylate monomer which are the raw materials of polyurethane(meth)acrylate.

From the viewpoint of improving heat resistance and improving softening point, the radical polymerizable composition may further contain a di(meth)acrylate having an oxyalkylene unit.

Although examples of di(meth)acrylates having an oxyalkylene unit include polyethylene glycol di(meth)acrylate and polypropylene glycol di(meth)acrylate, polyethylene glycol diacrylate is preferable in terms of further improving the reaction rate. Polyethylene glycol diacrylate has repeating units having a polyethylene glycol structure ($-CH_2CH_2O-$). Although there are no particular limitations on the number n of these repeating units, it is preferably an integer of 5 to 10.

Although there are no particular limitations on the content of the radical polymerizable composition in the electroconductive paste, it is normally 5% by mass to 30% by mass and preferably 10% by mass to 20% by mass.

(Plasticizer)

Examples of plasticizers that can be used include dicarboxylates, phosphates, polyesters and epoxidized vegetable oils and the like. These can be used alone or two or more types can be used as a mixture. Among these, dicarboxylates are used preferably since they improve heat resistance, dispersibility and meltability.

Dicarboxylates are obtained by esterification of a dicarboxylic acid and an alcohol.

Examples of dicarboxylic acids that can be used include fatty acids such as oxalic acid, malonic acid, succinic acid, glutaric acid, adipic acid, pimelic acid, suberic acid, azelaic acid or sebacic acid, and aromatic acids such as phthalic acid, isophthalic acid or terephthalic acid.

Examples of alcohols include alkyl alcohols such as capryl alcohol, lauryl alcohol, myristyl alcohol, cetyl alcohol, stearyl alcohol, oleyl alcohol or linoyl alcohol.

The dicarboxylate is particularly preferably dioctyl adipate obtained by reacting adipic acid and capryl alcohol. In this case, heat resistance can be further improved.

Triphenyl phosphate, for example, can be used for the phosphate.

The plasticizer is incorporated at a ratio of 5 parts by mass to 20 parts by mass based on 100 parts by mass of the radical polymerizable composition. If the ratio at which the plasticizer is incorporated based on 100 parts by mass of the radical polymerizable composition is less than 5 parts by mass, although hardness and adhesion of the electroconductive layer 2 to the plastic base 1 are superior when the circuit board 10 is used in a high-temperature environment, bendability decreases significantly. Conversely, if the ratio at which the plasticizer is incorporated based on 100 parts by mass of the radical polymerizable composition exceeds 20 parts by mass, although the electroconductive layer 2 has superior bendability in the case of using the circuit board 10 in a high-temperature environment, hardness and adhesion of the electroconductive layer 2 to the plastic base 1 decrease significantly.

The plasticizer is preferably incorporated at a ratio of 5 parts by mass to 10 parts by mass based on 100 parts by mass of the radical polymerizable composition. In this case, more superior hardness tends to be able to be obtained.

Moreover, from the viewpoint of imparting more superior bendability to the electroconductive layer 2, the plasticizer preferably has a boiling point of 300° C. to 500° C., and more preferably has a boiling point of 300° C. to 400° C. Furthermore, if the boiling point of the plasticizer is within the above-mentioned ranges, it becomes difficult for the plasticizer to escape from the electroconductive paste in comparison with the boiling point being lower than 300° C. in the case of irradiating the electroconductive paste with an electron beam.

Furthermore, the electroconductive paste may further contain additives, including a filler such as silica or a flame retardant such as magnesium hydroxide or aluminum hydroxide. In the above-mentioned electroconductive paste, the total content of the electroconductive powder, radical polymerizable composition, plasticizer and additives is preferably 70% by mass to 100% by mass. Here, additives refer to additives other than a polymerization initiator.

Next, the electroconductive layer 2 is formed by irradiating the electroconductive paste coated on the plastic base 1 with an electron beam. The circuit board 10 is obtained in this manner.

Although varying according to the composition of the electroconductive paste and the properties of the electroconductive layer 2 to be produced, conditions for irradiating with an electron beam normally consist of an absorbed dose of 100 kGy to 300 kGy, and an accelerating voltage of 150 kV to 300 kV.

EXAMPLES

Although the following provides a more detailed explanation of the contents of the present invention by listing examples and comparative examples thereof, the present invention is not limited to the following examples.

Examples 1 to 6 and Comparative Examples 1 to 3

Silver powder, radical polymerizable composition and plasticizer were mixed at the ratios shown in Table 1 and the mixtures were kneaded with a triple roll mill to obtain electroconductive pastes. Furthermore, a radical polymerizable composition containing a mixture of a bifunctional urethane-based oligomer, a monofunctional acrylate monomer and polyethylene glycol diacrylate (number n of repeating units having a polyethylene glycol structure=9) was used for the radical polymerizable composition. A polycarbonate-based urethane oligomer was used for the bifunctional urethane-based oligomer. In addition, values in Table 1 for which units are not specifically indicated are represented in units of mass %.

(2) Bendability

The bendability of each circuit board was evaluated based on an increase in resistivity following a bending test carried out after holding each above-mentioned circuit board in an oven set to 80° C. for 500 hours.

Namely, after first holding each above-mentioned circuit board in an oven set to 80° C. for 500 hours, resistivity of the electroconductive layer (initial resistivity) was measured according to the four-probe method using a digital multimeter.

Subsequently, each circuit board was bent 10 times to a radius of curvature R of 0, followed by measuring resistivity at that time (post-bending resistivity) in the same manner as described above. The rate of increase in resistivity was then calculated according to the following formula:

$$\text{Resistivity increase rate (\%)} = 100 \times (\text{post-bending resistivity}/\text{initial resistivity}).$$

TABLE 1

| | | Ex. 1 | Ex. 2 | Ex. 3 | Ex. 4 | Ex. 5 | Ex. 6 | Comp. Ex. 1 | Comp. Ex. 2 | Comp. Ex. 3 |
|---|---|---|---|---|---|---|---|---|---|---|
| Electroconductive powder | Silver powder | 85.6 | 85.0 | 84.5 | 83.9 | 85.0 | 85.0 | 86.2 | 85.8 | 83.6 |
| Radical polymerizable composition | Urethane-based oligomer (bifunctional) | 4.57 | 4.55 | 4.50 | 4.47 | 4.55 | 4.55 | 4.6 | 4.59 | 4.49 |
| | Acrylate monomer (monofunctional) | 4.57 | 4.55 | 4.50 | 4.47 | 4.55 | 4.55 | 4.6 | 4.59 | 4.49 |
| | Polyethylene glycol diacrylate (n = 9) | 4.57 | 4.55 | 4.50 | 4.47 | 4.55 | 4.55 | 4.6 | 4.59 | 4.49 |
| Plasticizer | DOA (dioctyl adipate) | 0.69 | 1.35 | 1.94 | 2.57 | — | — | — | 0.43 | 2.93 |
| | TPP (triphenyl phosphate) | — | — | — | — | 1.35 | — | — | — | — |
| | DOP (di-2-ethylhexyl phthalate) | — | — | — | — | — | 1.35 | — | — | — |
| Amt. of plasticizer incorporated based on 100 parts by mass of radical polymerizable composition (parts by mass) | | 5 | 10 | 15 | 20 | 10 | 10 | 0 | 3 | 21.8 |
| Hardness | Pencil hardness | F | B | B | B | B | B | F | B | 2B |
| Bendability | Initial resistivity (Ωcm) | $5.8 \times 10^{-5}$ | $5.8 \times 10^{-5}$ | $5.4 \times 10^{-5}$ | $6.3 \times 10^{-5}$ | $5.8 \times 10^{-5}$ | $5.9 \times 10^{-5}$ | $8.9 \times 10^{-5}$ | $5.2 \times 10^{-5}$ | $7.0 \times 10^{-5}$ |
| | Resistivity increase rate (%) | 94 | 67 | 92 | 54 | 65 | 67 | 149 | 217 | 43 |
| Adhesion of electroconductive layer to plastic base (points) | | 8 | 8 | 8 | 8 | 8 | 8 | 10 | 8 | 4 |

[Evaluation of Properties]

The electroconductive pastes obtained in Examples 1 to 6 and Comparative Examples 1 to 3 were coated onto a PET film having a thickness of 75 μm to have a coated thickness of 20 μm followed by irradiating with an electron beam under conditions of an accelerating voltage of 250 kV and absorbed dose of 200 kGy to form an electroconductive layer and obtain a circuit board.

Then, the following properties of each of the circuit boards obtained in the manner described above were evaluated.

(1) Hardness

The hardness of the electroconductive layers of each of the above mentioned circuit boards was evaluated according to pencil hardness measured in conformity with JIS K-5600-5-5. At this time, circuit boards having an electroconductive layer having a pencil hardness of B or higher were evaluated as acceptable, while circuit boards having an electroconductive layer having a pencil hardness lower than B were evaluated as unacceptable. The results are shown in Table 1. Here, a pencil hardness of B or higher refers to a pencil hardness of B or pencil hardness that is harder than B (such as F). A pencil hardness of less than B refers to a pencil hardness that is softer than B (such as 2B).

The results are shown in Table 1. Furthermore, the values for initial resistivity are also shown in Table 1.

Furthermore, with respect to bendability, those circuit boards having a resistivity increase rate of less than 100% were evaluated as having superior bendability and being acceptable, while those circuit boards having a resistivity increase rate of 100% or more were evaluated as having inferior bendability and being unacceptable.

(3) Adhesion

The adhesion of each of the circuit boards to a PET film was evaluated in the manner as indicated below. Namely, adhesion of each of the circuit boards was evaluated in compliance with the crosscut tape test defined in section 8.5.3 of JIS K-5400-8.5. More specifically, first, eleven parallel cuts were made at intervals of 1 mm on the electroconductive layer using a cutter knife. Next, eleven cuts were further made at intervals of 1 mm perpendicular to the first cuts. A large number of fragments were formed in the surface of the electroconductive layer in this manner. Cellophane adhesive tape was then affixed to the electroconductive layer, and the surface of the cellophane adhesive tape was rubbed with an eraser to completely adhere the cellophane adhesive tape to the electroconductive layer. Subsequently, one end of the cellophane adhesive tape was instantaneously peeled off while pulling at a right angle to the electroconductive layer. At this time, adhesion was scored as indicated below corresponding to the proportion of the surface area of the fragments that were peeled off relative to the total surface area of the fragments on the electroconductive layer prior to peeling.

| | |
|---|---|
| 0% | 10 points |
| Greater than 0% and not more than 5% | 8 points |
| Greater than 5% and not more than 15% | 6 points |
| Greater than 15% and not more than 35% | 4 points |
| Greater than 35% and not more than 65% | 2 points |
| Greater than 65% and not more than 100% | 0 points |

Then, those circuit boards having a score of 8 points or higher were evaluated as having superior adhesion of the electroconductive layer to PET and being acceptable, while circuit boards having a score of less than 8 points were evaluated as having inferior adhesion of the electroconductive layer to PET and being unacceptable.

On the basis of the results shown in Table 1, electroconductive layers formed by using the electroconductive pastes of Examples 1 to 6 achieved an acceptable level with respect to each of hardness, bendability and adhesion to a PET film. In contrast, electroconductive layers formed by using the electroconductive pastes of Comparative Examples 1 to 3 did not achieve an acceptable level with respect to any of hardness, bendability or adhesion to a PET film.

On the basis of these findings, the electroconductive paste of the present invention was confirmed to be able to form a circuit board having an electroconductive layer that has superior hardness and bendability as well as superior adhesion to a plastic base even if used in a high-temperature environment.

EXPLANATION OF REFERENCE NUMERALS

1: Plastic base
2: Electroconductive layer
10: Circuit board

The invention claimed is:

1. A method for producing a circuit board provided with a plastic base and an electroconductive layer provided on the plastic base,
the method comprising:
a step of coating an electroconductive paste for electron beam curing on the plastic base, and
a step of obtaining the circuit board by curing the electroconductive paste by irradiating with an electron beam to form an electroconductive layer,
an electroconductive paste consisting of an electroconductive powder; a radical polymerizable composition consisting of a mixture of a bifunctional urethane-based oligomer, a monofunctional acrylate monomer, and polyethylene glycol diacrylate; and a plasticizer,
the plasticizer being incorporated at a ratio of 5 parts by mass to 20 parts by mass based on 100 parts by mass of the radical polymerizable composition.

2. The method for producing a circuit board according to claim 1, wherein the plasticizer is a dicarboxylate.

3. The method for producing a circuit board according to claim 2, wherein the dicarboxylate is dioctyl adipate.

4. The method for producing a circuit board according to claim 1, wherein the plasticizer is incorporated at a ratio of 5 parts by mass to 10 parts by mass based on 100 parts by mass of the radical polymerizable composition.

5. The method for producing a circuit board according to claim 1, wherein the radical polymerizable composition further contains a di(meth)acrylate having an oxyalkylene unit.

6. The method for producing a circuit board according to claim 1, wherein the content of the radical polymerizable composition in the electroconductive paste is 5% by mass to 20% by mass.

* * * * *